March 15, 1966 D. L. WHITE 3,240,962

PIEZOELECTRIC TRANSDUCER

Filed July 3, 1962

INVENTOR
D. L. WHITE
BY Roy M. Porter, Jr.
ATTORNEY

United States Patent Office 3,240,962
Patented Mar. 15, 1966

3,240,962
PIEZOELECTRIC TRANSDUCER

Donald L. White, Mendham, N.J., assignor to Bell Telephone Laboratories, Incorporated, New York, N.Y., a corporation of New York Filed July 3, 1962, Ser. No. 208,185
11 Claims. (Cl. 310—8)

This application is a continuation-in-part of my copending application Serial No. 147,283, filed October 24, 1961, now abandoned.

This invention relates to piezoelectric transducers of the types commonly used with ultrasonic delay lines and more particularly to transducers with fundamental resonance modes at frequencies in the heretobefore difficult range of from 30 to 500 megacycles per second as well as at frequencies outside of this range.

In order to obtain an efficient piezoelectric transducer, it is advantageous that the thickness of the piezoelectric element be of the order of a half wavelength of the ultrasonic vibration. This, of course, requires extremely thin transducer elements for use in the high frequency range. In my copending application Serial No. 64,808, filed October 25, 1960, it is disclosed that the depletion layer formed at a p-n junction in semiconductive materials forms a piezoelectric layer that may vary from one of exceedingly thin thickness up to one of about one micron in thickness and therefore having a fundamental resonance frequency extending down to about 500 megacycles per second. This range may be further lowered only by employing materials having a degree of purity that is at present difficult to obtain. At the other end of the micro-wave frequency range, quartz crystals have been made in wagers that have thicknesses as small as 25 microns and produce resonance frequencies in fundamental modes at frequencies as high as 30, or at the very best, 50 megacycles. Thin crystal wafers, however, present unwarranted difficulties in handling, bonding, mounting, et cetera.

It is, therefore, an object of the present invention to extend the range of piezoelectric transducers.

It is a further object to form piezoelectric media in thickness that produces resonance in an extended frequency range and particularly in the range from 30 to 500 megacycles per second.

In accordance with the present invention, a thin, substantially uniform layer of high resistivity piezoelectric, semiconductive material is formed integrally upon a low resistivity base or substrate. The substrate may be of the same general composition as the layer or of material that at least has a crystal structure and a unit cell size that is similar to that of the layer material even though of different composition. In either case the impurity content of the layer and of the base are made substantially different so that the layer has a resistivity many times that of the base. This is essential since the piezoelectric phenomenon appears only in high resistivity solids wherein an electric field large enough to produce a piezoelectric response can be supported. It is only recently that piezoelectric effects have been observed in some of the materials here contemplated because they are generally too conductive to support the required field.

The impurity-controlled, high resistivity of the layer may be obtained in several ways. First, the layer may be formed by processes to be described of material that is of such high purity that current carriers in the layer material are virtually absent. Alternatively, the current carriers may be compensated by doping the layer materials with other impurities of a type which is known to trap or compensate the current carriers of the original material without itself introducing other current carriers.

According to a first embodiment of the invention, the process of epitaxial growth is employed to form a high resistivity layer upon a low resistivity substrate. The substrate material is particularly oriented so that the crystal axis thereof that corresponds to the desired piezoelectric axis in the layer material is more or less aligned with the thickness dimension of the layer. Thus, since the nature of epitaxial growth is such that the crystals of the layer align themselves with the crystals of the substrate, the piezoelectric axis of the layer is properly determined. The substrate becomes one electrode and a conductive film deposited upon the epitaxial layer serves as the other electrode.

In accordance with specific examples of the invention which will be given hereinafter, cubic piezoelectric semiconductive material of the group III–V compounds, such as gallium phosphide or gallium arsenide, in high resistivity form, are epitaxially grown upon substrates of low resistivity forms of the same material or upon substrates of the low resistivity cubic group IV elements, such as germanium and silicon. Alternatively, hexagonal piezoelectric semiconductive material of the group II–VI compounds, such as cadmium sulphide or zinc oxide are epitaxially grown upon substrates of low resistivity forms of the same materials. The required high resistivity of the layer thus formed may be obtained by maintaining the purity of the layer, by depositing compensating material during the epitaxial growth or by diffusion after the layer is formed.

In accordance with another embodiment of the invention the layer is formed entirely by diffusion. In this embodiment the layer and the substrate have the same basic composition and differ in impurity content only.

The piezoelectric layers produced in accordance with the present invention have thicknesses that are proper for resonance in the fundamental mode over a wide range of frequencies which include that range heretofore difficult to obtain. The piezoelectric layer is inherently bonded to the substrate so that previously experienced difficulties in handling and bonding elements of small size are removed. The resulting transducers have a high degree of electromechanical coupling and are highly efficent.

These and other objects, the nature of the present invention, its various features and advantages will appear more fully upon consideration of the various illustrative embodiments now to be described in detail in connection with the accompanying drawings, in which.

Figure 1:
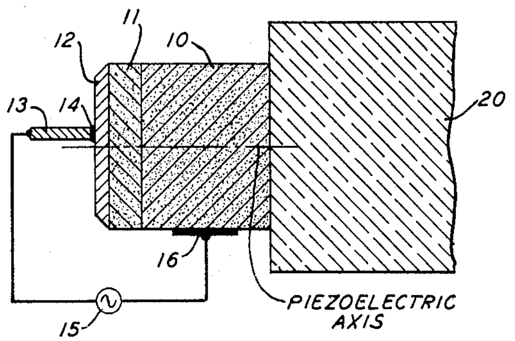
FIG. 1 is a cross-sectional view of a transducer utilizing a high resistivity epitaxially grown layer of semiconductive material to support a piezoelectric field in accordance with the invention.

Referring more particularly to FIG. 1, the transducer comprises a block of low resistivity semiconductive material 10 forming the substrate element and one low resistance contact, a layer 11 forming the high resistivity piezoelectric layer epitaxially deposited upon a selected face of block 10, and a gold film 12 evaporated on the opposite face of layer 11 to a suitable depth and forming the other low resistance contact. Contact is made to gold film 12 by wire 13 employing an indium bond 14. The source 15 of alternating current to be converted by the transducer into ultrasonic waves is connected between wire 13 and an ohmic contact, such as by a deposited metal film 16, upon any available surface of block 10. Suitable deposit materials are nickel or tin. Block 10 is mechanically bonded to ultrasonic delay media 20.

In the particular embodiment to be first described, the material of both block 10 and layer 11 is gallium arsenide. The material of block 10 is given a low resistivity as defined hereinafter, by doping it with ionized impurity atoms. Suitable doping materials are zinc, tin, sulfur, selenium and other materials familiar to the art that have known usefulness in increasing the conductivity of gallium arsenide and similar compounds. It is immaterial whether the particular doping material is otherwise designated as a donor or an acceptor material.

The face of block 10 on which layer 11 is to be deposited is selected with a view to the orientation of the piezoelectric axis desired in layer 11. Recall that it is the nature of epitaxial growth that the deposited crystals build up upon the substrate in an alignment that follows the crystal orientation of the substrate. Employing the Miller indices, the piezoelectric axis of layer 11 of cubic gallium arsenide is the [110] and equivalent axes for shear vibrational modes and the [111] and equivalent axes for longitudinal vibrational modes. Thus, the {110} or equivalent face or the {111} or equivalent face of substrate 10 is selected to receive layer 11 depending upon the mode of vibration desired. These faces are, of course, those normal to the desired piezoelectric axis.

For the purposes of the present invention, it is necessary that the deposited layer material have a high resistivity as compared with the low resistivity of the substrate material. Apart from the very important mechanical function of the substrate, the only electrical function thereof is to provide contact to the layer. Its impedance should, therefore, be small and predominantly resistive to avoid electrical losses. The resistivity of the layer on the other hand must be high enough to support the required piezoelectric field and its impedance should be predominantly capacitive. Several criteria may be helpful in relating the limits of the two ranges. Recall that at a given operating frequency the resistive impedance of any semiconductor is equal to its capacitive impedance when the resistivity is:

$$\rho_0=\frac{1}{\omega\epsilon}$$

where $\omega$ is the angular operating frequency and $\epsilon$ is the permitivity ($8.85\times10^{-14}$ farads/cm. $\times$ dielectric constant). Therefore, the resistivity $\rho_1$ of the layer should be many times greater than $\rho_0$ and the resistivity $\rho_2$ of the substrate should be many times less than $\rho_0$. Experimental results indicate that a factor of 10 in each case produces useful results although larger factors are obviously preferred. Therefore, $\rho_1>10\rho_0$ and $$\rho_2<\frac{\rho_0}{10}$$

Furthermore, the total resistance $R_2$ of the substrate is $$\frac{\rho_2 l}{A}$$

where l is the length of the substrate and A is its area and the total resistance $R_1$ of the layer is $$\frac{\rho_1 T}{A}$$

where T is the thickness of the layer. The capacitive reactance $Z_1$ of the layer at the operating frequency is $$\frac{\rho_0 T}{A}$$

For efficient power transfer to the capacitive layer $Z_1$ through the series substrate resistance $R_2$ when the layer is shunted by its internal resistance $R_1$, it is necessary that $R2<10Z_1$ and $$R_1>\frac{Z_1}{10}$$

It follows then that $$\rho_2>\frac{100\rho_1 T}{l}$$

Therefore, the terms high resistivity as applied to the layer and low resistivity as applied to the substrate as used herein specifically mean resistivities that meet the foregoing qualifications. The required high resistivity of the layer may be obtained for the purposes of the present invention in at least three ways, each of which has been employed by the art in connection with other types of semiconductive devices. First, the layer material may be in suffciently pure form to obtain the required resistivity. As to each specific material the degree of purity required to obtain this resistivity is known to the art. Alternatively, known doping materials may be deposited along with the layer material which compensate the current carriers in the layer material and form traps which render the deposit of high resistivity. Finally, the doping material may be added by a diffusion process to the layer after it is deposited. As a specific example, gallium arsenide may be compensated by copper. Other doping materials and the techniques for handling them are known to the art.

Care must be taken when employing diffusion that the diffused atoms make the epitaxial layer highly resistive but yet do not so compensate the substrate as to decrease its conductivity by any substantial amount. This may be prevented by doping the substrate, and particularly that portion near the surface upon which the epitaxial layer is to be put, with material in sufficiently heavy concentration that the substrate conductivity is maintained in spite of stray diffusion of compensating atoms through the layer. As will be pointed out hereinafter, the epitaxial step may be omitted under the proper circumstances and the layer formed from the substrate by the diffusion process.

Several methods involving both vapor transfer and liquid transfer for epitaxially depositing materials of the types here considered, either in pure form or along with the desired impurity, are well known to the art and it appears necessary only to summarize one of the vapor methods for the purposes of the present disclosure. In general, the process relies on a vapor transfer phenomenon of semiconductive material from a solid phase source to the substrate. The transfer mechanism involves the preferential oxidation of the source material to a vapor state and a transfer of the vapor to the substrate, each of these occurring by virtue of a well defined spacial relation and temperature gradient. The procedure requires a transfer block or wafer having the composition and conductivity desired for the layer and a substrate of the desired material to which the material of the transfer block is transferred. In the formation of an epitaxial layer, the substrate material and the material of the layer must have compatible crystal lattice structures, that is, similar crystal structure and equivalent unit cell size. Otherwise, any two semiconductive materials may be chosen for the layer and the substrate.

The transfer material and the substrate are then mounted in a container filled, according to one process, with a halogen containing gas. The transfer block and the substrate are heated to a temperature preferably just below the melting point of the lowest melting component. A temperature gradient is maintained between the transfer block and the substrate by disposing the heating element nearer to the transfer material.

More specific processes, techniques and apparatus for practicing the processes are described in the I.B.M. Technical Journal of Research and Development, volume 4, Number 3, July 1960, wherein substantially the entire issue thereof is directed to this subject matter. In addition, the copending applications of Kleimack et al., Serial No. 35,152, filed June 10, 1960, now U.S. Patent 3,165,811, granted January 19, 1965; H. C. Theuerer, Serial No. 61,505, filed October 10, 1960, now U.S. Patent 3,142,596, granted July 28, 1964; and C. J. Frosch, Serial No. 130,089, filed August 8, 1961, are directed to improved processes.

The preceding discussion has been illustrated by the specific example of cubic, piezoelectric gallium arsenide. Gallium phosphide and indium arsenide form phosphide, properly stabilized aluminum phosphide, indium antimonide of group III–V are for all present purposes equivalent to gallium arsenide with the exception of modifications known to the art in the epitaxial growth process. In addition, cubic group II–VI materials such as zinc sulphide (zinc blend), cadmium sulphide, and zinc oxide may be employed.

Materials of group II–VI having a hexagonal or wurtzide structure may also be used for both the epitaxial layer and the substrate to practice the invention. Specific examples in this group are cadmium sulphide and zinc oxide. In addition, hexagonal forms of zinc sulphide, cadmium selenide, zinc selenide and magnesium telluride have suitable properties. Impurities such as indium, gallium or chlorine are suitable for rendering the substrate of low resistivity and impurities such as copper, lithium and silver are suitable for compensating the deposited crystals to render them of high resistivity. Since the piezoelectric axis of these materials is along the hexagonal axis to produce longitudinal waves and normal to the hexagonal axis to produce shear waves, the substrate material is oriented according to the intended vibration mode as described above.

Figure 2:
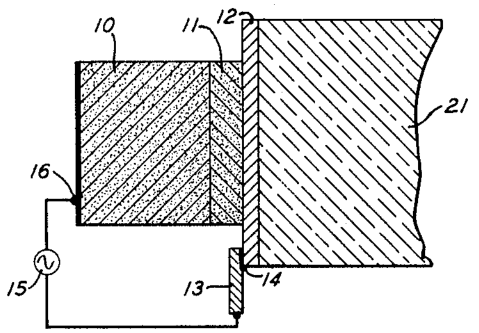
FIG. 2 illustrates an alternative coupling of a transducer in accordance wth the invention to an ultrasonic delay line.

The resulting transducer may be mechanically coupled to an ultrasonic delay line 20 by suitably bonding substrate block 10 to the end of the delay line material 20. This configuration is known as a resonant transducer and is characterized by high efficiency and a relatively narrow band centered upon the resonant frequency. However, metal film 12 may be located adjacent to delay medium 21, as shown in FIG. 2, and suitably bonded to the delay medium. This configuration is referred to in the art as a loaded transducer and is characterized by having a broad band. Corresponding reference numerals have otherwise been employed in FIGS. 1 and 2.

As illustrated, the transducers of FIGS. 1 and 2 are connected to delay media of materials different from the material of either substrate 10 or layer 11. However, it should be noted that the substrate material may itself be of sufficient length to constitute the delay medium. However, the group III–V and II–VI compounds are relatively expensive and difficult to handle and ordinarily used for delay media only in special circumstances.

Figure 3:
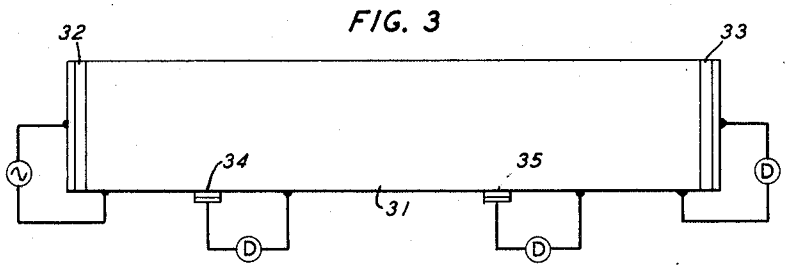
FIG. 3 illustrates an ultrasonic delay line in which the material of the delay line also comprises the substrate of the epitaxially grown transducer.

Piezoelectric epitaxial layers may, however, be grown upon other materials that are suitable for serving both as the delay medium and as the conductive substrate. This is illustrated with reference to FIG. 3. Here strip 31 constitutes a delay line made of low resistivity cubic group IV elements or of any other materials which are known to have desirable characteristics for delay lines at high frequencies and that also have a crystal structure compatible to that of the desired epitaxial layer. Compatibility implies a similarity in both the crystal structure and the unit cell size. Specific examples of suitable group IV elements are silicon and germanium. Epitaxial layers 32 and 33 of high resistivity, piezoelectric, semiconductive material are deposited on either end of strip 31 upon faces that have been selected as described above for producing the desired alignment of the piezoelectric axis of the layer. By eliminating the joint between 10 and 20 of FIG. 1 or between 12 and 21 of FIG. 2, a perfect mechanical bond between the transducer 32 or transducer 33 and the line 31 is obtained. The devices labeled D associated with transducer 33 represent detectors or devices for utilizing the electrical energy reconverted from the delayed ultrasonic energy by transducer 33.

With reference to the selection of the material for layers 32 and 33 so that the layer materials have compatible crystal lattice structures to that of the substrate-delay line material, specific examples may be given. Thus, if line 31 is of cubic silicon, gallium phosphide, which has an equivalent unit cell size, may comprise the epitaxial layer. If line 31 is germanium the epitaxial layer may be gallium arsenide.

A further feature of this embodiment of the invention resides in the ultrasonic taps, such as 34 and 35. Each tap may be identical to the main transducer except for size and may be grown epitaxially at spaced intervals along the length of line 31 whereby a signal may be taken off the line at some time earlier than the maximum delay interval. The tape should have a dimension measured in the direction of propagation of the wave along the line that is in the order of one-half wavelength. Since the taps are small there is little disturbance to the propagating wave.

It is evident to those skilled in the art that the epitaxial layer must have a thickness which extends substantially in the direction of the piezoelectric axis of the material, although it is not necessary that this thickness correspond identically to the piezoelectric axis as long as a substantial component of the axis lies in the proper directions. The term "piezoelectric face" as used herein and in the appended claims is, therefore, intended to define a face which is related to a piezoelectric axis such that a signal introduced in a direction perpendicular to the face will establish a significant piezoelectric field in the crystal. Obviously, the preferred piezoelectric faces are substantially perpendicular to a piezoelectric axis. However, departures from this optimum orientation can be tolerated while still obtaining the desired piezoelectric effects.

The term "epitaxial," as used herein, should be understood in its broadest sense as designating a process by which one material is grown or deposited upon a base material that is somewhat different, either in terms of composition, impurity content, resistivity or other property, and in which the grown material is deposited in a crystal structure, the orientation of which is determined by the crystal orientation of the base material. It includes those processes referred to in the art as hydrothermal synthesis, flux growth, and equivalent processes as well as those specifically described in the above-mentioned publications and patents.

For those applications in which there is no advantage in having the substrate of different basic composition from the layer, the layer may be formed by diffusing compensating materials directly into the substrate. Referring again to FIG. 1, for example, layer 11 represents the portion of low resistivity, semiconductive material 10 that has been increased in resistivity by diffusing into material 10 an impurity that traps or compensates the current carriers that account for the original low resistivity of material 10.

For specific example, block 10 may be formed of cadmium sulphide which has been made of low resistivity by suitable doping with indium or chlorine or both as suggested above. A thin film 12 of copper may then be evaporated upon the selected surface normal to piezoelectric axis of the cadmium sulphide. When the combination is heated in a vacuum at about 400° C. for several minutes, some of the copper diffuses into the surface and traps the electrons contributed by the impurities to the crystal lattice without itself introducing holes which contribute to conduction. The diffused layer is overcompensated, therefore, has a high resistivity many times that of the substrate. Substrate 10 should preferably have a resistivity no greater than the limits of $\rho_2$ set forth hereinbefore while the diffused layer 11 should have a resistivity no less than the limits of $\rho_1$ set forth hereinbefore. The thickness of the diffused layer increases with the heating time and temperature and may be controlled to produce a layer thickness that is resonant at the desired operating frequency. In addition to copper, silver and gold are known to make cadmium sulphide, zinc sulphide and similar semiconductors of high resistivity. Compensating materials for other semiconductors have been set forth hereinbefore. Further, high resistivity semiconductor systems are disclosed in the copending applications of A. R. Hutson, Serial No. 20,572, filed April 7, 1960, now U.S. Patent No. 3,091,707, granted May 28, 1963, and W. P. Mason, Serial No. 833,868, filed August 14, 1959, which was refiled as Serial No. 197,158 and is now U.S. Patent No. 3,122,662, granted February 25, 1964. Considerations regarding thickness, direction of extent, loading, application of contacts and structural advantages discussed above with reference to the epitaxially produced layer apply equally to the diffusion produced layer.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. A piezoelectric transducer comprising a base member of low resistivity semiconductive material, a thin layer of high resistivity piezoelectric semiconductive material formed integrally upon said base member, said high resistivity being many times that of said low resistivity as a result of substantial differences in the impurity content of said layer material and said base material, said high resistivity being many times greater than $$\frac{1}{\omega\epsilon}$$

where $\omega$ is the angular operating frequency and $\epsilon$ is the permitivity of said layer material, the thickness of said layer extending substantially in the direction of the piezoelectric axis of said layer, an electrode located adjacent to said layer on the face thereof opposite from said base, and means for impressing an alternating-current electric field between said base member and said electrode.

2. The transducer according to claim 1 wherein the current carriers that normally determine the resistivity of said layer material are compensated by further impurities in said layer.

3. The transducer according to claim 2 wherein said further impurities are added to said thin layer by diffusion.

4. The transducer according to claim 2 wherein said thin layer is formed epitaxially upon said base member.

5. A piezoelectric transducer comprising a layer of high resistivity piezoelectric material having a predetermined piezoelectric axis defined relative to the crystal structure of said material, a substrate member of low resistivity material having a crystal structure that is similar to the crystal structure of said layer material and a given crystal axis that corresponds to the piezoelectric axis of said layer material, said layer material being integrally formed upon a face of said substrate material that is substantially normal to said given axis so that said piezoelectric axis is aligned with said given axis, said layer material having both the current carriers that normally determine the resistivity of said layer material substantially compensated by additional impurities to increase said layer resistivity, and means for impressing an alternating current electric field across said layer in the direction of said axes.

6. The transducer according to claim 5 wherein said substrate material is a low resistivity form of a group III–V compound and wherein said layer material is a high resistivity form of a group III–V compound.

7. The transducer according to claim 6 wherein said materials are both selected from the group consisting of gallium arsenide and gallium phosphide.

8. The transducer according to claim 5 wherein said substrate material is a low resistivity form of a group II–VI compound and wherein said layer material is a high resistivity form of a group II–VI compound.

9. The transducer according to claim 8 wherein said materials are both selected from the group consisting of cadmium sulphide and zinc oxide.

10. The transducer according to claim 5 wherein said substrate material is a group IV element and wherein said layer material is a high resistivity form of a group III–V element.

11. The transducer according to claim 10 wherein said substrate material is selected from the group consisting of silicon and germanium and wherein said layer material is selected from the group consisting of gallium phosphide and gallium arsenide.

References Cited by the Examiner

UNITED STATES PATENTS

| | | | |
|---|---|---|---|
| 2,698,909 | 1/1955 | Wright et al. | 310—9.5 |
| 2,925,502 | 2/1960 | Franx | 310—9.5 |
| 3,018,539 | 1/1962 | Taylor et al. | 29—25.3 |
| 3,038,241 | 6/1962 | Minden | 29—25.3 |
| 3,057,762 | 10/1962 | Gans | 317—235 X |
| 3,109,758 | 11/1963 | Batdorf et al. | 317—235 X |

MILTON O. HIRSHFIELD, *Primary Examiner.*